United States Patent
Tanaka et al.

[11] Patent Number: 6,036,994
[45] Date of Patent: Mar. 14, 2000

[54] SCREEN PRINTING METHOD AND APPARATUS THEREFOR

[75] Inventors: Tetsuya Tanaka, Kofu; Ken Takahashi, Yamanashi; Akihiko Wachi, Yamanashi; Takao Naito, Yamanashi, all of Japan

[73] Assignee: Matsushita Electric Industrial Co., Ltd., Japan

[21] Appl. No.: 09/180,267

[22] PCT Filed: May 20, 1997

[86] PCT No.: PCT/JP97/01702

§ 371 Date: Nov. 6, 1998

§ 102(e) Date: Nov. 6, 1998

[87] PCT Pub. No.: WO97/44192

PCT Pub. Date: Nov. 27, 1997

[30] Foreign Application Priority Data

May 22, 1996  [JP]  Japan ..................... 8-126667

[51] Int. Cl.⁷ ................. B05D 5/12; B05C 17/06
[52] U.S. Cl. ................. 427/10; 427/96; 427/282; 101/126; 101/DIG. 36; 33/620; 118/712; 118/213
[58] Field of Search ................. 101/126, 129, 101/DIG. 36, 485, 486; 33/620; 427/96, 282, 8, 10; 118/712, 213

[56] References Cited

U.S. PATENT DOCUMENTS

| 5,176,078 | 1/1993 | Homma et al. .................. 101/126 |
| 5,452,656 | 9/1995 | Becher et al. .................. 101/126 |
| 5,740,729 | 4/1998 | Hikita et al. .................. 101/126 |

FOREIGN PATENT DOCUMENTS

| 63-280490 | 11/1988 | Japan . |
| 2-123788 | 11/1990 | Japan . |
| 5229094 | 7/1993 | Japan . |
| 6238867 | 8/1994 | Japan . |
| 858058 | 3/1996 | Japan . |

*Primary Examiner*—Brian K. Talbot
*Attorney, Agent, or Firm*—Price, Gess & Ubell

[57] ABSTRACT

A screen printing method is provided in which the exchange of machine types is achieved in a short time and even minute patterns or narrowly pitched patterns can be precisely positioned for screen printing. The method comprises finding an amount of movement of the circuit board from positions of recognition marks (2, 2) on a circuit board (1) and positions of recognition marks (5, 5) on a screen plate (4), positioning the circuit board (1) in relation to the screen plate (4) on the basis of the amount of movement of the circuit board (1), detecting a discrepancy between a pattern of apertures (18) and a pattern of lands (19) in a particular portion of the circuit board (1), finding a positional correction from the discrepancy, and positioning the circuit board (1) in relation to the screen plate (4) on the basis of the amount of movement of the circuit board and the positional correction.

9 Claims, 6 Drawing Sheets

SCREEN PRINTING METHOD AND APPARATUS THEREFOR

TECHNICAL FIELD

The present invention relates to a method of and an apparatus for screen printing in which a paste material such as conductive paste or cream solder is screen printed on a circuit board in a process of mounting an electronic component onto the circuit board.

BACKGROUND ART

Screen printing methods have been used for printing a pattern of cream solder or the like on a circuit board in an electronic component mounting process. Circuit boards have become more and more minute in recent years due to miniaturization of electronic devices, because of which the demand for highly precise printing of materials such as cream solder has been increased.

A screen printing apparatus employing a conventional screen printing method is explained by referring to FIGS. 5 and 6.

Referring to FIG. 5, the screen printing apparatus comprises a circuit board recognition unit A and a printing unit B. Reference numerals 1, 2, and 3 respectively represent a circuit board, board recognition marks provided on the circuit board 1, and a stage for positioning the circuit board 1, which is driven by an X-axis motor 9 for traveling along the X direction between the circuit board recognition unit A and the printing unit B.

The printing unit B includes a screen plate 4, screen recognition marks 5, 5 provided on the screen plate 4, a camera 6 for visually recognizing the board recognition marks 2, 2 and the screen recognition marks 5, 5, a screen frame 7 with which the screen plate 4 is secured, a screen holder 8 which holds the screen frame 7, a Y-axis motor 10 for driving the stage 3 along the Y direction, a θ-axis motor 11 for driving the stage 3 along the θ direction, a printing paste 12, and a left squeeze 13 and a right squeeze 14 which run directly on the screen plate 4 along the horizontal direction to print the printing paste 12 on the circuit board 1.

Actions according to the conventional screen printing method is explained referring to the flowchart of FIG. 6.

At Step #21 shown in FIG. 6, a teaching operation is performed in which the two screen recognition marks 5, 5 on the screen plate 4 are recognized by the camera 6, and the distances (SX1, SY1) and (SX2, SY2) respectively from the camera origin point are recorded. Also, the board recognition marks 2, 2 on the circuit board 1 are recognized by the camera 6, and the distances (PX1, PY1) and (PX2, PY2) respectively from the camera origin point are recorded, before the procedure moves to Step #22.

At Step #22, a circuit board 1 is loaded into the circuit board recognition unit A and positioned on the stage 3, and the procedure goes to Step #23.

At Step #23, the two board recognition marks 2, 2 on the circuit board 1 are recognized by the camera 6, and the amount of displacement from the points (PX1, PY1) and (PX2, PY2) of the board recognition marks 2, 2 taught at Step #21 is calculated so as to determine the amount of movement of the stage 3 in the X, Y, and θ directions by the X-axis motor 9, Y-axis motor 10, and θ-axis motor 11 which are all connected to the stage 3.

This is followed by Step #24 where the stage 3 is driven to move by the X-axis motor 9, Y-axis motor 10, and θ-axis motor 11 according to the determined amount of movements, after which the stage 3 is transferred from the circuit board recognition unit A to the printing unit B, and the procedure advances to Step #25.

At Steps #25 and #26, the stage 3 is lifted up so as to bring the circuit board 1 into contact with the screen plate 4, and the procedure goes to Step #27.

At Step #27, the two squeezes 13 and 14 are descended to contact the screen plate 4 and moved to the right or left in direct contact with the screen plate 4 to print the printing paste 12 on the circuit board 1, and the procedure goes to Step #28.

At Step #28, the circuit board 1 which has been printed with the paste is unloaded and Step #29 follows.

It is judged at Step #29 whether the printing operation is finished or not. If not, the procedure returns to Step #22. If the printing has been finished, the procedure is terminated.

However, it is not perfectly accomplished that the stage 3 is moved from the circuit board recognition unit A to the printing unit B with high accuracy along the X and Y directions horizontally and lifted vertically after the circuit board 1 on the stage 3 is precisely positioned in the circuit board recognition unit A, hence causing discrepancy in locations.

Also, since a circuit board 1 of high mounting density in recent years carries very minute or narrowly pitched patterns, it is hardly possible to make all the patterns of lands on the circuit board 1 to correspond to all the patterns of apertures in the screen plate 4, however strictly the accuracy of dimensions of both the circuit board 1 and the screen plate 4 is controlled. Even when both recognition marks are in register with each other a, very small discrepancy is inevitable in a part containing minute or narrowly pitched patterns, which may cause an imperfect print such as a bridge. A common method for correcting such a discrepancy in positions of patterns comprises the steps of printing paste 12 on the circuit board 1 on trial, measuring either optically or with the use of an instrument the amount of discrepancy in positions of the land pattern and the pattern of paste 12 printed in a portion where minute or narrowly pitched patterns are formed, saving the amount measured as a data for correction, and adding this amount for correction to the amount of displacement calculated at the Step #23 described above in each printing process. In this case, since the squeezes 13, 14 move to the right and left respectively, at least two trial printing actions with the squeezes 13, 14 in two directions, leftward and rightward, are needed, wherefore it takes time when the type of circuit board to be manufactured is changed from one to another.

It is an object of the present invention to provide a screen printing method and an apparatus therefor, by which the above problems are solved, i.e., the work time for changing the type of circuit board is shortened since no test printing is required, as well as minute or narrowly pitched patterns are quite accurately screen printed.

DISCLOSURE OF INVENTION

In order to solve the above problems, the screen printing method according to a first feature of the present invention is characterized in that, in a positioning process in which an aperture pattern in a screen plate is positioned relative to a land pattern on a circuit board for performing screen printing of a printing paste on the circuit board over the screen plate, said positioning process comprises the steps of: recognizing positions of board recognition marks on the circuit board and positions of screen recognition marks on the screen plate; obtaining an amount of movement of the circuit board based on said positions of both of the recognition marks; positioning the circuit board in relation to the screen plate based on the obtained amount of movement of the circuit board and bringing the circuit board into direct contact with the screen plate; recognizing positions of the aperture pattern in the screen plate and positions of the land pattern in a specific portion of the circuit board through the aperture pattern of the screen plate; detecting an amount of discrepancy between the positions of the aperture pattern and the positions of the land pattern from a result of recognition; finding an amount of movement for positional correction of the circuit board in order for making the aperture pattern in register with the land pattern on the basis of the detected amount of discrepancy; and positioning the circuit board in relation to the screen plate based on said amount of movement of the circuit board and the amount of movement for positional correction.

In order to solve the above problems, the screen printing apparatus according to a second feature of the present invention including a stage by which a circuit board is supported, moved, and positioned, driving means for driving the stage in an X, Y, and θ directions, a screen plate to which the circuit board that has been positioned is contacted, and a squeeze which is moved on the screen plate in direct contact therewith for printing a pattern of printing paste on the circuit board that has been positioned, is characterized by having: an imaging means by which positions of board recognition marks on the circuit board and positions of screen recognition marks on the screen plate are recognized as well as positions of an aperture pattern in the screen plate and positions of a land pattern in a specific portion of the circuit board through the aperture pattern in a state where the circuit board is closely contacted with the screen plate are recognized; an image processing unit by which an amount of movement of the stage in the X, Y, and θ directions required for making the positions of both recognition marks in register with each other is calculated, as well as an amount of movement of the stage for positional correction required for making the positions of the aperture pattern and the land pattern is calculated based on the positions of the aperture pattern and the land pattern recognized through the aperture pattern; and a control unit for controlling the driving means on the basis of the calculated amount of movement of the stage in the X, Y, and θ directions and the amount of movement for positional correction so as to position the circuit board in relation to the screen plate such that the aperture pattern corresponds to the land pattern.

According to the present invention, in the positioning process, the positions of board recognition marks on the circuit board and of screen recognition marks on the screen plate are first recognized; an amount of movement of the circuit board for matching the positions of the board recognition marks on the circuit board with the positions of the screen recognition marks on the screen plate is obtained based on said positions of both recognition marks; the circuit board is positioned in relation to the screen plate based on the obtained amount of movement of the circuit board and brought into contact with the screen plate; the positions of an aperture pattern in the screen plate and of a land pattern on the circuit board through the aperture pattern are recognized in a specific portion of the circuit board; an amount of discrepancy in positions of said patterns of apertures and lands is detected from a result of recognition; an amount of position correcting movement of the circuit board for matching the aperture pattern in the screen plate with the land pattern on the circuit board is calculated based on the obtained amount of discrepancy in positions between the patterns of apertures and lands; and the circuit board is positioned in relation to the screen plate based on the amount of movement of the circuit board and the amount of position correcting movement of the circuit board, by which the above mentioned two problems are solved, the work time when the types of circuit board are changed from one to another is decreased as there is no need for test printing, and even minute or narrowly pitched patterns can be precisely screen printed.

BEST MODE FOR CARRYING OUT THE INVENTION

A screen printing method and one example of the apparatus therefor according to the present invention will be described referring to FIGS. 1 to 4.

Figure 1:
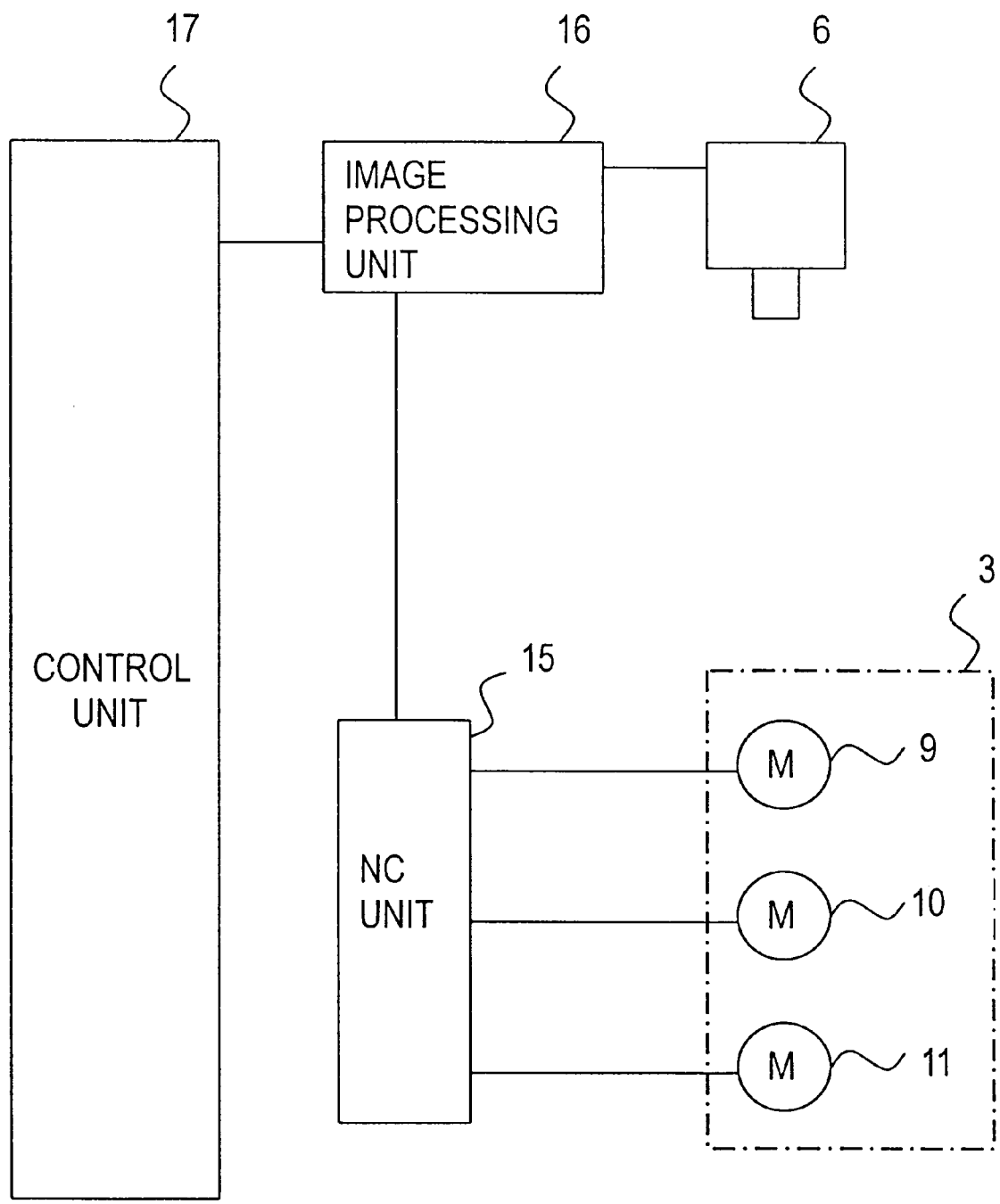
FIG. 1 is a block diagram showing primary parts of the construction of a screen printing apparatus according to one embodiment of the present invention.
Figure 2:
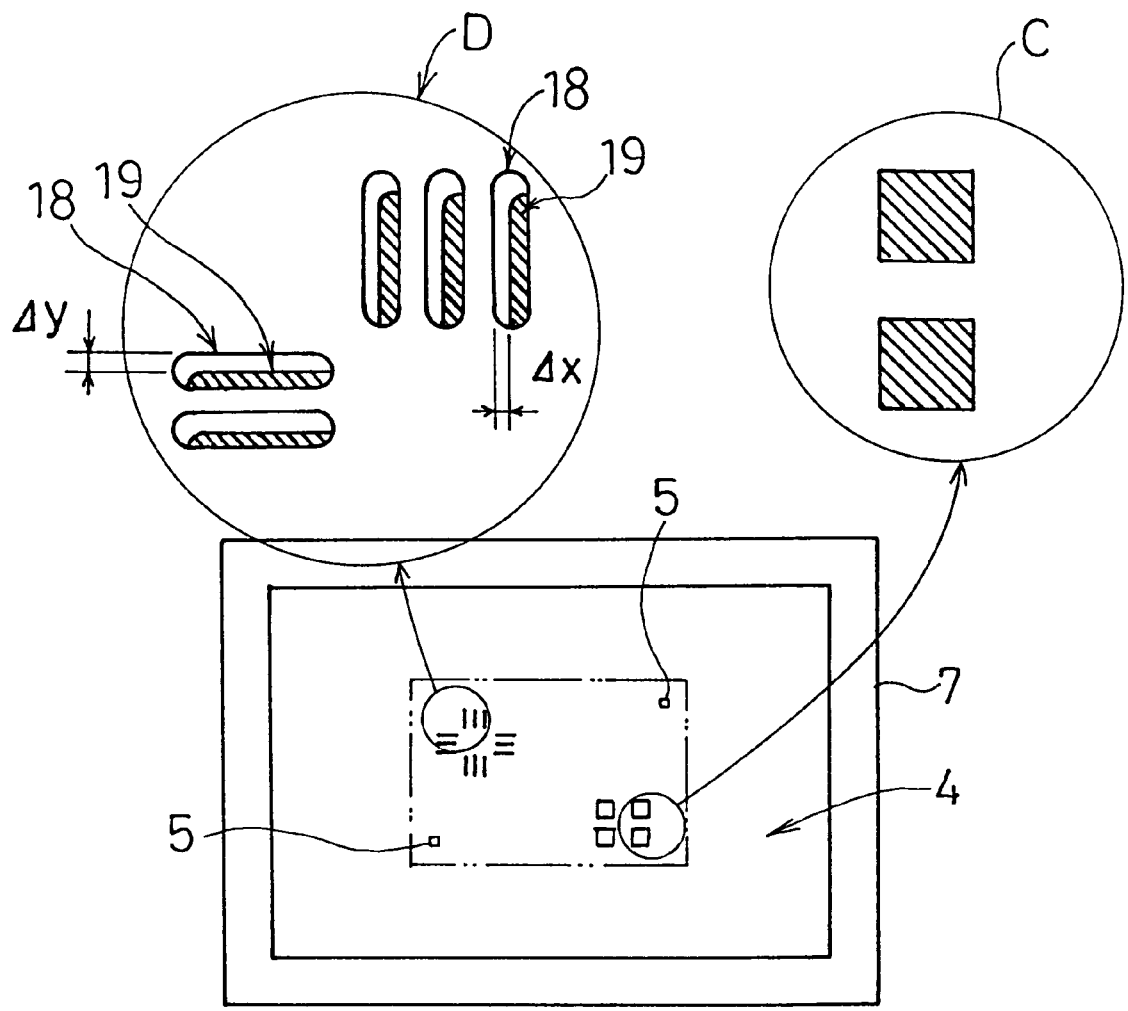
FIG. 2 is a diagram showing a positioning process in the apparatus.
Figure 2:
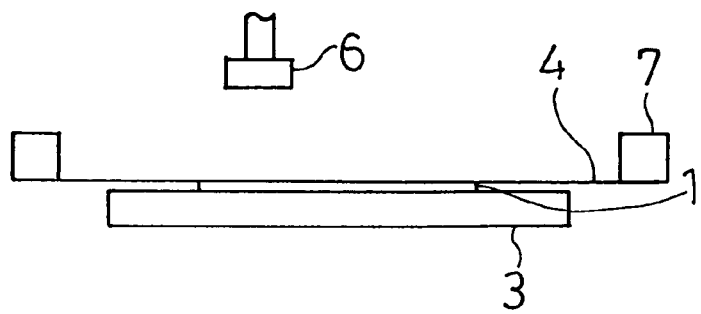
Figure 5:
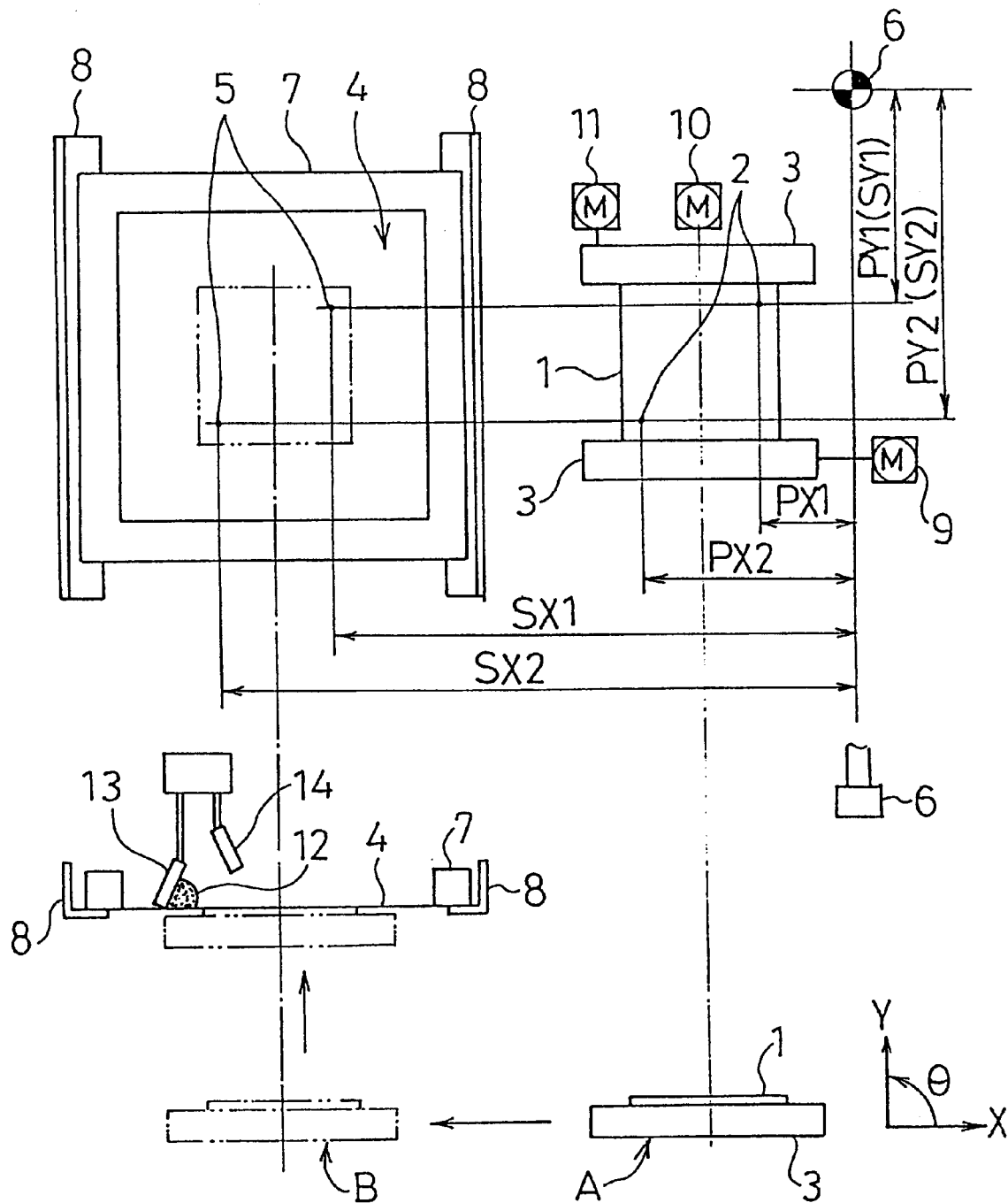
FIG. 5 is a typical view showing the construction of a conventional screen printing apparatus.
Figure 6:
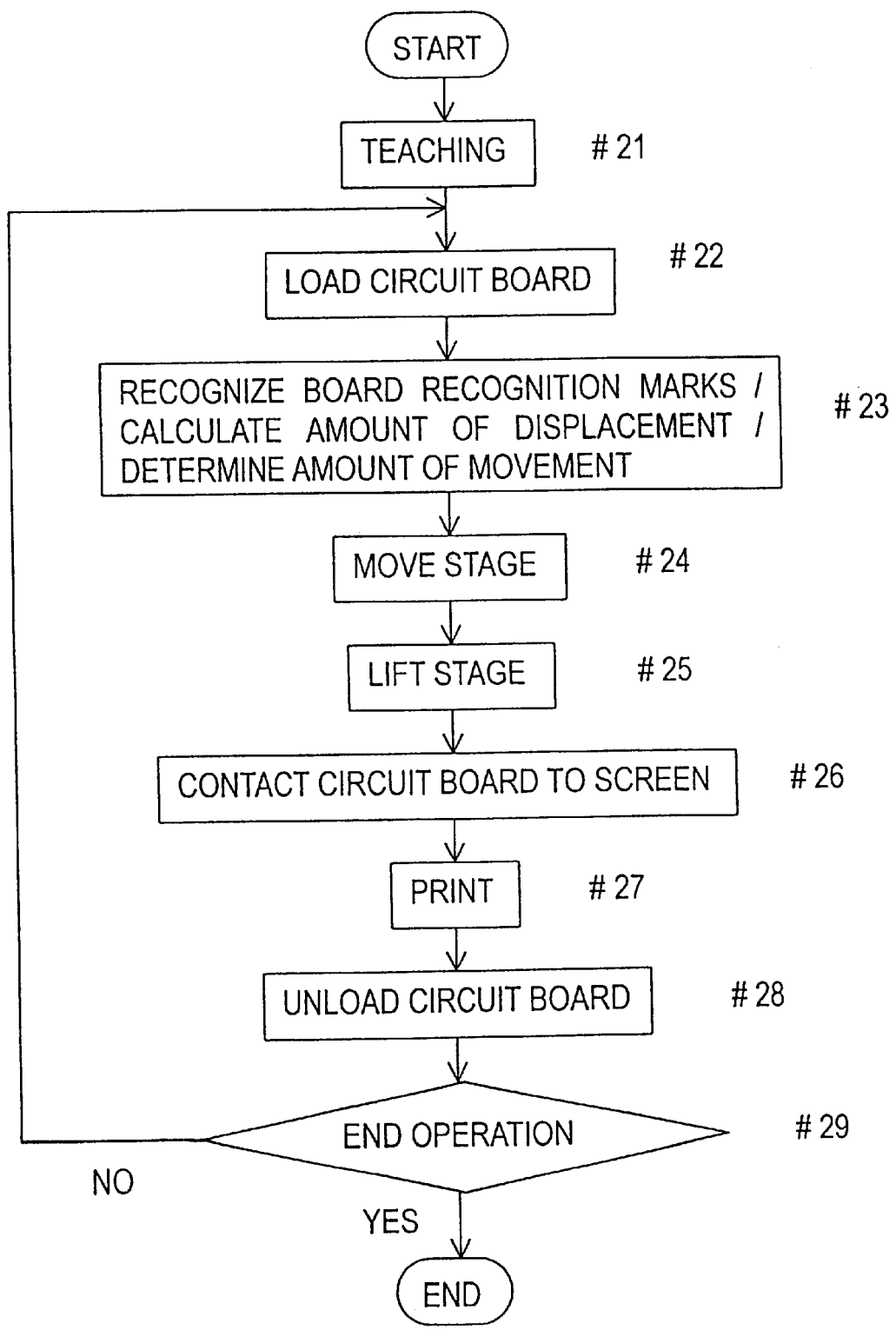
FIG. 6 is a flowchart showing a conventional screen printing method.

The screen printing apparatus employing the screen printing method of this embodiment is first explained referring to FIGS. 1, 2, and 5.

The screen printing apparatus of this embodiment incorporates an arrangement shown in FIG. 1 in addition to the conventional construction shown in FIG. 5 wherein the board recognition marks 2, 2 on a circuit board 1 in the circuit board recognition unit A and the two screen recognition marks 5, 5 on a screen plate 4 in the printing unit B are recognized and the recognized results are used for positioning such that the board recognition marks 2, 2 on the circuit board 1 and the screen recognition marks 5, 5 on the screen plate 4 are in register with each other.

Repeated descriptions of the other parts in the conventional apparatus shown in FIG. 5 will be omitted.

Referring to FIGS. 1 and 2, the camera 6 has a function to recognize positions of a pattern of apertures 18 in the screen plate 4 and of a pattern of lands 19 on the circuit board 1 through the pattern of apertures 18 of the screen plate 4 with respect to a specific portion including minute patterns or narrowly pitched patterns on the circuit board 1 in a state where the circuit board 1 is in contact with the screen plate 4 at the printing unit B. An image processing unit 16 has a function to calculate an amount of movement for correcting the position of the stage 3 such that the pattern of apertures 18 and the pattern of lands 19 are in register with each other, based on the data on positions of the pattern of apertures 18 and the pattern of lands 19 on the circuit board 1 recognized through the pattern of apertures 18.

Furthermore, an NC unit 15 has a function to position the circuit board 1 in relation to the screen plate 4 by driving the X-axis motor 9, Y-axis motor 10, and θ-axis motor 11 so as to move the stage 3 in the X, Y, and θ directions by an amount of movement which is defined by adding the amount of correction in position to the basic amount of movement which has been explained with respect to the conventional apparatus. Reference numeral 17 represents a control unit for controlling the overall actions.

Next, actions performed in the positioning process in this embodiment will be described referring to FIGS. 2 and 3.

Figure 3:
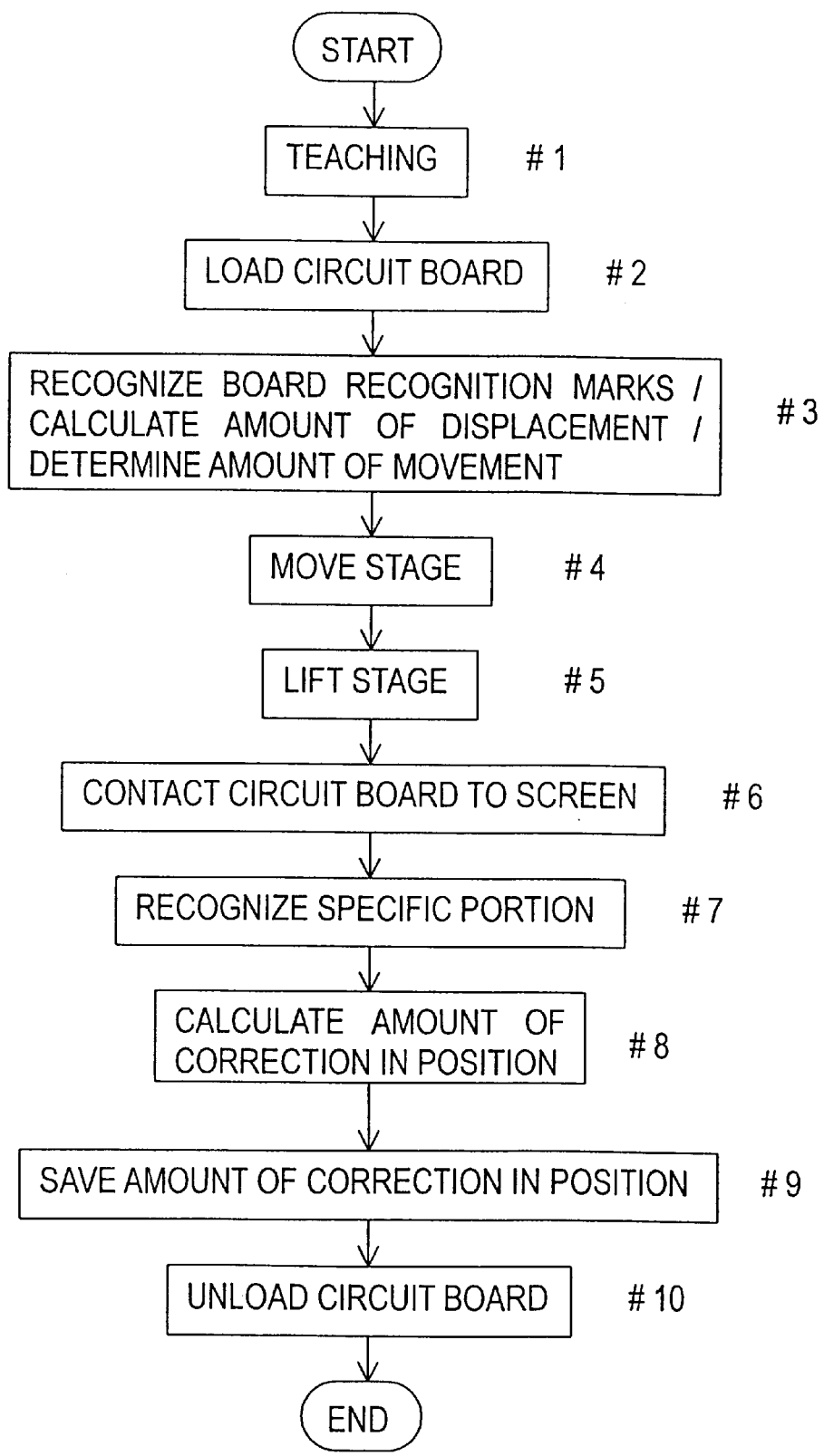
FIG. 3 is a flowchart of the process of positioning in the apparatus.

At Step #1 shown in FIG. 3, a teaching action is made in which the screen recognition marks 5, 5 on the screen plate 4 serving as reference points in the printing unit B are recognized by the camera 6 to record distances (SX1, SY1) and (SX2, SY2) respectively from the camera origin point and also the board recognition marks 2, 2 on a circuit board 1 serving as reference points in the circuit board recognition unit A are recognized by the camera 6 to record the distances (PX1, PY1) and (PX2, PY2) respectively from the camera origin point. The procedure then moves to Step #2.

At Step #2, a circuit board 1 is loaded onto the circuit board recognition unit A and positioned on the stage 3 and the procedure goes to Step #3.

At Step #3, the board recognition marks 2, 2 on the circuit board 1 are recognized by the camera 6, and the amount of displacement from the reference points (PX1, PY1) and (PX2, PY2) recorded in the teaching action at Step #1 is calculated for determining the basic amount of movement of the circuit board 1 by the X-axis motor 9, the Y-axis motor 10, and the θ-axis motor 11 mounted on the stage 3. The final amount of movement of the stage 3 is determined by adding to this basic amount of movement the amount of position correcting movement ΔX, ΔY, and Δθ which will be explained later.

At Step #4, the stage 3 is transferred from the circuit board recognition unit A to the printing unit B according to the amount of circuit board movement, and the procedure goes to Step #5.

At Step #5, the stage 3 is lifted up and at Step #6, the circuit board 1 which has been positioned at the primary stage is brought into contact with the screen plate 4.

At Step #7, a specific portion D which includes minute patterns and narrowly pitched lines as shown in FIG. 2 is viewed by the camera 6 to recognize the positions of a pattern of apertures 18 in the screen plate 4 and of a pattern of lands 19 of the circuit board 1 through the pattern of apertures 18. This is followed by Step #8 where the amount of displacement Δx and Δy between the pattern of apertures 18 and the pattern of lands 19 are detected from the recognized results and the amount of correcting movement ΔX, ΔY, and Δθ required for making the pattern of apertures 18 in register with the pattern of lands 19 in the portion D is calculated.

It is, however, still difficult to make all pattern of lands on the circuit board 1 and the pattern of apertures in the screen plate 4 to be correspondent to each other however accurately the dimensions of both the circuit board 1 and the screen plate 4 are set, as the circuit board 1 of high mounting density carries a complex combination of minute patterns and narrowly pitched lines. For example, as shown in FIG. 2, while a land pattern on the circuit board 1 and an aperture pattern in the screen plate 4 are in perfect register in a portion C, the portion D exhibits discrepancy over the minute patterns and the narrowly pitched lines. Especially in the portion which contains minute patterns and narrowly pitched lines, even a slight displacement may cause a critical fault such as a bridge. In correcting positions, therefore, priority is given to the perfect recognition between the pattern of apertures 18 and the pattern of lands 19 in the portion D which contains minute patterns and narrowly pitched lines. Although the patterns of apertures and of lands do not match perfectly in the portion C shown in FIG. 2, this causes no serious troubles as the pattern in this portion is widely spaced.

Although not shown, in the event that the entire pattern is displaced to such an extent that the positions of land patterns 19 on the circuit board 1 cannot be recognized through the pattern of apertures 18 in the screen plate 4, an alarm is generated to stop the operation.

At Step #9, the amounts of position correction ΔX, ΔY, and Δθ are saved. The amount of movement of the screen plate 4 in the X, Y, and θ directions effected by the X-axis motor 9, the Y-axis motor 10, and the θ-axis motor 11 is determined in the printing step which will be described later, based on the basic movement of the circuit board 1 and the amount of movement for position correction. This summed amount of movement will be used in the following printing step for moving and positioning each of the circuit boards.

At Step #10, the circuit board 1 given for the positioning purpose is unloaded whereby the positioning process is finished without performing any trial printing action.

Figure 4:
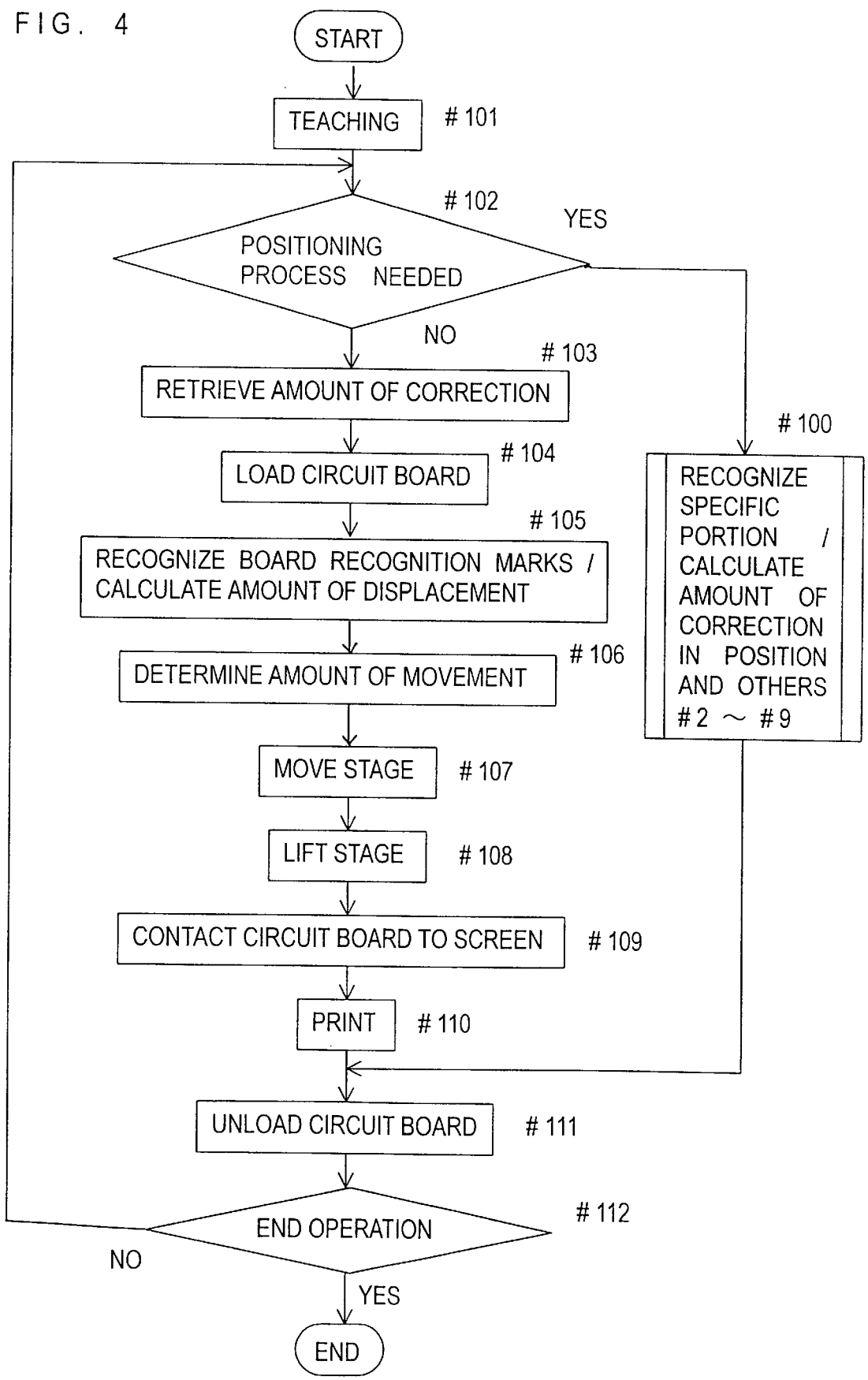
FIG. 4 is a flowchart showing a process of printing in the apparatus.

FIG. 4 illustrates a printing process including the positioning process described above. After the teaching action has been completed at Step #101, it is judged at Step #102 whether the prescribed positioning step is necessary or not. If it is required, the procedure goes to Step #100 where the positioning process as described above of recognizing positions in the specific portion and calculating the amount of position correction (Steps #2 to #9 in FIG. 3) is executed. There are various cases where such positioning process is necessary such as the examples ① and ② given below, and the program may be set in advance according to these cases.

① At the time of printing a circuit board first time after the type of circuit board has been changed, once each for rightward printing (the squeeze 13 being moved to the right-hand side in FIG. 5) and for leftward printing (the squeeze 14 being moved to the left-hand side in FIG. 5).

② At the time of printing a next circuit board after completing printing of all circuit boards of a predetermined (e.g. 30) number. It is preferable that such number of printing can be arbitrarily set.

If the positioning process is not necessary, the procedure moves to Step #103 where the amount of position correction ΔX, ΔY, and Δθ recorded in the positioning procedure is retrieved. At Step #104, a circuit board 1 is loaded and at Step #105, the amount of displacement from the board recognition marks 2, 2 is obtained using the camera 6 for determining the basic movement of the circuit board as the reference. At Step #106, the amount of movement of the stage in the X, Y, and θ directions effected by the X-axis motor 9, the Y-axis motor 10, and the θ-axis motor 11 is determined based on the basic amount of movements and the amount of position correction ΔX, ΔY, and Δθ.

Next, in Steps #107 to #109, where the stage 3 is moved and lifted up according to the amount of movement so as to bring the circuit board 1 in contact with the screen plate 4. The screen printing is carried out at Step #110 and the circuit board 1 is unloaded at Step #111. Finally, it is judged at Step #112 whether the series of operation has been completed or not. If not, the procedure returns to Step #102 and when yes, the procedure is terminated.

It is possible to provide a construction such that the positioning process at Step #100 is repeated in each printing operation. In this case, in place of the recording step at Step #9 in FIG. 3 where the amount of positional correction is saved, the amount of movement required for correcting the position of circuit board 1 in the X, Y, and θ directions by the X-axis motor 9, the Y-axis motor 10, and the θ-axis motor 11 is determined based on the amount of positional correction ΔX, ΔY, and Δθ, the stage 3 is lowered to bring the circuit board 1 apart from the screen plate 4, the circuit board 1 is moved and positioned based on the amount of positional correction, after which the stage 3 is lifted up again to bring the circuit board 1 in contact with the screen plate 4 for the screen printing. If the positional correction of the circuit board is not necessary, the step of the screen printing may directly follow.

INDUSTRIAL APPLICABILITY

With the screen printing method and the apparatus therefor according to the present invention, problems found in prior arts in positioning the land pattern of circuit board and the aperture pattern of screen plate are all solved, the work time when the type of machine is changed is reduced as there is no need for test printing, and even minute or narrowly pitched patterns can be precisely screen printed, wherefore the present invention is useful if applied in an electronic component mounting process for mounting an electronic component on the circuit board.

What is claimed is:

1. A screen printing method including a positioning process in which an aperture pattern (18) in a screen plate (4) is positioned relative to a land pattern (19) on a circuit board (1) for performing screen printing of a printing paste (12) on the circuit board (1) over the screen plate (4), said positioning process comprising the steps of: recognizing positions of board recognition marks (2, 2) on the circuit board (1) and positions of screen recognition marks (5, 5) on the screen plate (4); obtaining an amount of movement of the circuit board based on said positions of both of the recognition marks (2, 2, 5, 5); positioning the circuit board (1) in relation to the screen plate (4) based on the obtained amount of movement of the circuit board and bringing the circuit board (1) into direct contact with the screen plate (4); recognizing positions of the aperture pattern (18) in the screen plate (4) and positions of the land pattern (19) in a specific portion of the circuit board (1) through the aperture pattern (18) of the screen plate (4); detecting an amount of discrepancy between the positions of the aperture pattern (18) and the positions of the land pattern (19) from a result of recognition; finding an amount of movement for positional correction of the circuit board in order for making the aperture pattern (18) in register with the land pattern (19) on the basis of the detected amount of discrepancy; and positioning the circuit board (1) in relation to the screen plate (4) based on said amount of movement of the circuit board and the amount of movement for positional correction.

2. The screen printing method according to claim 1, wherein the positioning process is repeated in each printing process.

3. The screen printing method according to claim 1, wherein the positioning process is performed after change of machine types where the type of circuit board (1) has been changed, once each with respect to the first one of the circuit boards for leftward and rightward printing actions respectively.

4. The screen printing method according to claim 1, wherein the positioning process is performed when printing a next circuit board after a predetermined number of circuit boards (1) have been printed.

5. A screen printing apparatus including a stage (3) by which a circuit board (1) is supported, moved, and positioned, driving means (9, 10, 11) for driving the stage (3) in an X, Y, and θ directions, a screen plate (4) to which the circuit board (1) that has been positioned is contacted, and a squeeze (13, 14) which is moved on the screen plate (4) in direct contact therewith for printing a pattern of printing paste (12) on the circuit board (1) that has been positioned, characterized by having: an imaging means (6) by which positions of board recognition marks (2, 2) on the circuit board (1) and positions of screen recognition marks (5, 5) on the screen plate (4) are recognized as well as positions of an aperture pattern (18) in the screen plate (4) and positions of a land pattern (19) in a specific portion of the circuit board (1) through the aperture pattern (18) in a state where the circuit board (1) is closely contacted with the screen plate (4) are recognized; an image processing unit (16) by which an amount of movement of the stage (3) in the X, Y, and θ directions required for making the positions of both recognition marks (2, 2, 5, 5) in register with each other is calculated, as well as an amount of movement of the stage (3) for positional correction required for making the positions of the aperture pattern (18) and the land pattern (19) is calculated based on the positions of the aperture pattern (18) and the land pattern (19) recognized through the aperture pattern (18); and a control unit (17) for controlling the driving means (9, 10, 11) on the basis of the calculated amount of movement of the stage (3) in the X, Y, and θ directions and the amount of movement: for positional correction so as to position the circuit board (1) in relation to the screen plate (4) such that the aperture pattern (18) corresponds to the land pattern (19).

6. The screen printing method according to claim 1 further including the step of providing an alarm indication if the step of detecting an amount of discrepancy between the position of the aperture pattern and the position of the land pattern cannot be determined.

7. In a circuit board screen printing system wherein indicia on a circuit board substrate and on a screen plate are recognized automatically and used to move the screen plate relative to the circuit board substrate for alignment prior to apply a pattern onto the circuit board substrate, the improvement comprising:

imaging means for recognizing the position of an aperture on the screen plate and the position of a land pattern on the circuit board substrate;

control unit means for calculating any discrepancy in alignment between the recognized aperture and the recognized position of a land pattern that corresponds to the aperture; and driving means for providing a relative movement of the screen plate and the circuit board substrate to minimize any discrepancy prior to enabling an application of a pattern onto the circuit board substrate.

8. The invention of claim 7 further including means for providing an alarm indication if the amount of discrepancy between the recognized aperture and the recognized position of the land pattern cannot be determined.

9. The invention of claim 7 wherein the control unit means can ascertain different combinations of apertures and land patterns of different sizes and can prioritize those apertures and land patterns having the smallest dimensions as the operational discrepancy to enable the driving means to provide the relative movement to minimize any discrepancy between the aperture and land patterns of the smallest dimensions.

* * * * *